United States Patent [19]

Imai et al.

[11] Patent Number: 5,677,204
[45] Date of Patent: Oct. 14, 1997

[54] METHOD OF EVALUATING A THIN FILM FOR USE IN SEMICONDUCTOR DEVICE

[75] Inventors: Yukari Imai; Toshiharu Katayama; Naoko Otani, all of Tokyo, Japan

[73] Assignee: Mitsubishi Denki Kabushiki Kaisha, Tokyo, Japan

[21] Appl. No.: 630,211

[22] Filed: Apr. 10, 1996

[30] Foreign Application Priority Data

Oct. 17, 1995 [JP] Japan .................... 7-268722

[51] Int. Cl.$^6$ .................... H01L 21/66; H01L 21/306; H01L 21/479; G01R 31/26
[52] U.S. Cl. .................... 437/8; 437/172
[58] Field of Search .................... 437/8, 43, 52, 437/170, 172; 205/123, 124; 324/71.5, 765, 769

[56] References Cited

U.S. PATENT DOCUMENTS

| | | | |
|---|---|---|---|
| 4,729,970 | 3/1988 | Nath et al. | 437/170 |
| 5,141,603 | 8/1992 | Dickey et al. | 205/124 |
| 5,172,207 | 12/1992 | Nojiri et al. | 437/170 |

FOREIGN PATENT DOCUMENTS

| | | |
|---|---|---|
| 61-34947 | 2/1986 | Japan . |
| 61-137329 | 6/1986 | Japan . |
| 5 90244 | 4/1993 | Japan . |

OTHER PUBLICATIONS

Patent Abstracts of Japan, Section E, Section No. 416, vol. 10, No. 186, p. 124 Jun. 28, 1986.

*Primary Examiner*—John Niebling
*Assistant Examiner*—Brian K. Dutton
*Attorney, Agent, or Firm*—Oblon, Spivak, McClelland, Maier & Neustadt, P.C.

[57] ABSTRACT

A semiconductor device (100) including a silicon substrate (1), a gate oxide film (2) formed on the silicon substrate (1) and having a defect (3) and a dielectric breakdown voltage failure portion (4), and a polysilicon film (5) formed on the gate oxide film (2) is immersed in a chemical etchant (7) in a wet etching apparatus (9). With the silicon substrate (1) serving as an anode, a DC voltage source (6) of the wet etching apparatus (9) applies voltage to the silicon substrate (1) to perform anode oxidation. Passivation layers (10) are formed on parts of the surface of the polysilicon film (5) which overlies the defect (3) and dielectric breakdown voltage failure portion (4) but are not formed on the surface of the polysilicon film (5) in regions insulated by the gate oxide film (2). The polysilicon film (5) in the regions on which the passivation layers (10) are not formed is removed by the chemical etchant (7).

15 Claims, 20 Drawing Sheets

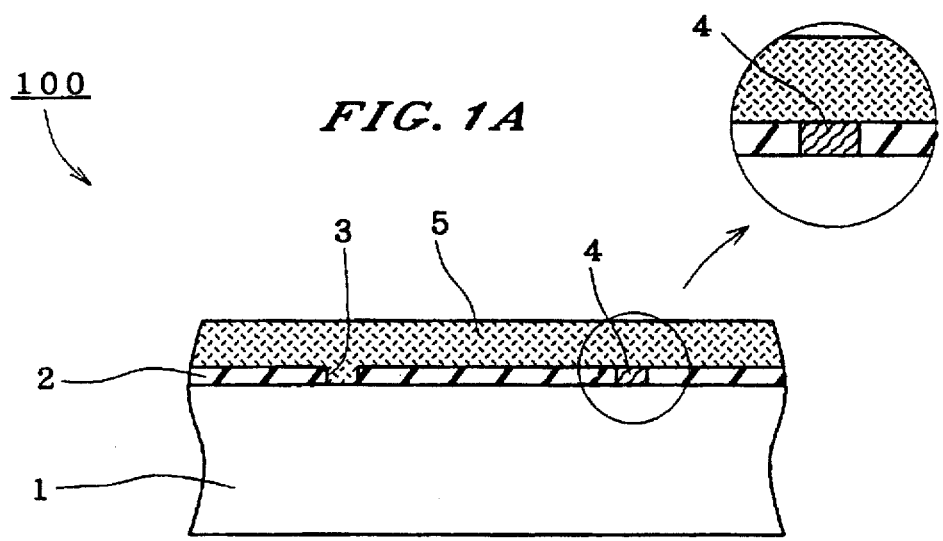
FIG. 1B
FIG. 1A
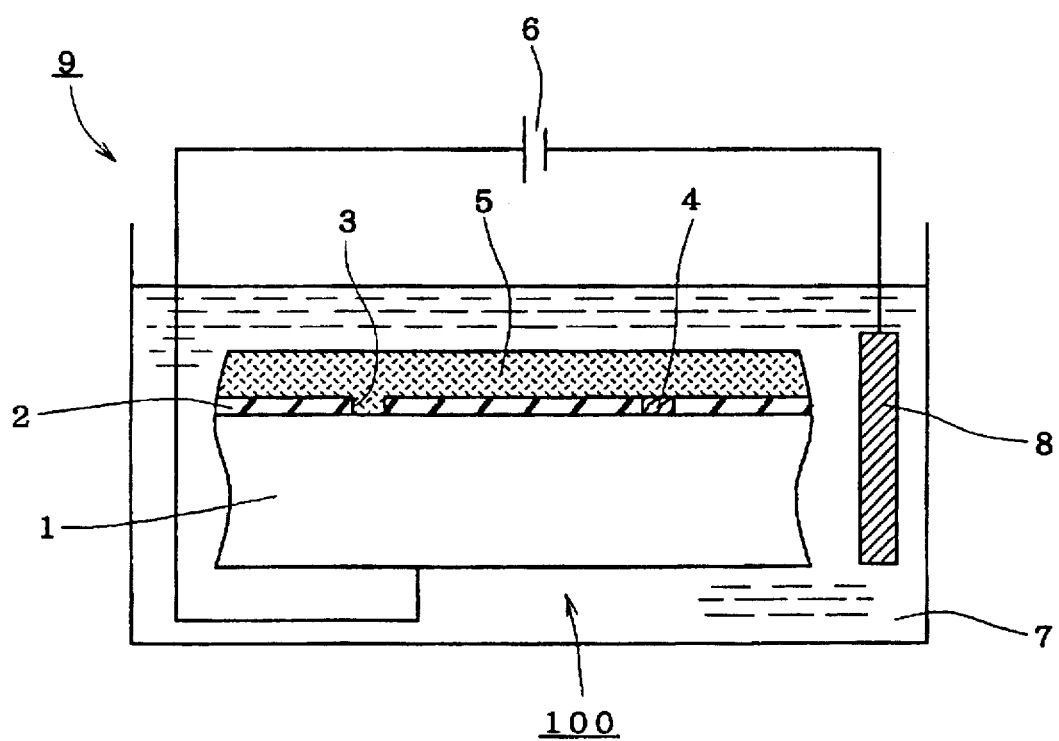
FIG. 2

METHOD OF EVALUATING A THIN FILM FOR USE IN SEMICONDUCTOR DEVICE

BACKGROUND OF THE INVENTION

1. Field of the Invention

The present invention relates to a method of evaluating a thin film for use in a semiconductor device.

2. Description of the Background Art

In the past, the chemical wet etching process using a chemical etchant has been used to evaluate thin oxide films for use in a semiconductor device.

FIGS. 25 to 27 are cross-sectional views showing process steps of a conventional method of evaluating an oxide film of a semiconductor device in sequential order.

The structure of a semiconductor device 100 to be evaluated is illustrated in FIG. 25. The semiconductor device 100 comprises a gate oxide film 2 formed on a silicon substrate 1 and serving as an insulating thin film, and a polysilicon film 5 formed on the gate oxide film 2. The gate oxide film 2 has a defect 3 and a dielectric breakdown voltage failure portion 4 resulting from a film quality anomaly.

The semiconductor device 100 is immersed in a chemical etchant 7 as shown in FIG. 26. The chemical etchant 7 typically includes an alkaline solution containing KOH, NaOH, LiOH, CsOH, $NH_4OH$, ethylenediamine pyrocatechol, hydrazine, and choline. For example, 5N KOH raised to a temperature of 60° C. may be used as the chemical etchant 7.

After the polysilicon film 5 is etched away by the chemical etchant 7, the silicon substrate 1 is ached along its crystal face through the defect 3 of the gate oxide film 2, thereby forming an etching trace 30 in a position corresponding to the defect 3 as shown in FIG. 27.

The thin film (gate oxide film and the like) has conventionally been evaluated in the above-described procedure. The dielectric breakdown voltage failure portion 4, if present, acts as a mask for the silicon substrate 1 against the chemical etchant 7 to form no etching trace 30, which makes it impossible to detect the dielectric breakdown voltage failure portion 4. Further, the amount of current leakage which differs depending upon the size of the dielectric breakdown voltage failure portion 4 is not determined.

SUMMARY OF THE INVENTION

According to a first aspect of the present invention, a method of evaluating a semiconductor device comprises the steps of: (a) immersing in a solution containing a hydroxyl group a semiconductor device including a first semiconductor layer, an insulating film formed on the first semiconductor layer, and a second semiconductor layer formed on the insulating film; and (b) applying voltage to the solution, with the first semiconductor layer serving as an anode.

Preferably, according to a second aspect of the present invention, the value of the voltage is varied.

Preferably, according to a third aspect of the present invention, the semiconductor device is an EEPROM comprising a semiconductor substrate, a gate oxide film, and a floating gate electrode corresponding respectively to the first semiconductor layer, the insulating film, and the second semiconductor layer.

Preferably, according to a fourth aspect of the present invention, the semiconductor device is a DRAM comprising a capacitor lower electrode, a capacitor insulating film, and a capacitor upper electrode corresponding respectively to the first semiconductor layer, the insulating film, and the second semiconductor layer.

Preferably, according to a fifth aspect of the present invention, the value of the voltage is periodically varied.

Preferably, according to a sixth aspect of the present invention, the value of the voltage includes a first voltage value and a second voltage value lower than the first voltage value, the first and second voltage values being alternated repeatedly.

Preferably, according to a seventh aspect of the present invention, a pulse width duty cycle of the voltage is not more than 50%.

In the first aspect of the present invention, the electric conductivity of the defect and dielectric breakdown voltage failure portion in the insulating film is utilized to form the passivation layers on the parts of the second semiconductor layer which overlies the defect and dielectric breakdown voltage failure portion, and simultaneously to remove the second semiconductor layer in the regions which are insulated and on which the passivation layers are not formed by the solution. Observation of the passivation layers allows quick and simple evaluation of the defect and dielectric breakdown voltage failure portion.

In the second aspect of the present invention, the growth of the passivation layers may be increased and decreased, and the amount of the formed passivation layers may be decreased by chemical etching using the solution. The passivation layers are prevented from growing to an excessive amount, allowing accurate evaluation of the defect and dielectric breakdown voltage failure portion.

The third aspect of the present invention provides for the evaluation of the defect and dielectric breakdown voltage failure portion in the gate oxide film of the EEPROM.

The fourth aspect of the present invention provides for the evaluation of the defect and dielectric breakdown voltage failure portion in the capacitor insulating film of the DRAM.

In the fifth aspect of the present invention, a desired periodically varying voltage pattern is stored in the voltage source to provide a suitable amount of the passivation layers to be formed without difficulty.

In the sixth aspect of the present invention, since the applied voltage is a pulse voltage, the passivation layers are formed while repeatedly growing and being removed by the solution. The amount of the passivation layers to be formed is more suitable in addition to the fourth and fifth aspects of the present invention. The use of an easy-to-control pulse voltage facilitates accomplishment.

The seventh aspect of the present invention permits the growth and the removal by the solution of the passivation layers to be suitably balanced. This further improves the effect of the sixth aspect of the present invention.

As described above, according to the present invention, the insulating film is evaluated while voltage is applied in the solution containing the hydroxyl group. This permits the evaluation of the presence or absence of the dielectric breakdown voltage failure portion as well as the defect in the insulating film, and the estimation of the amount of leakage current which differs depending on the degree of the defect. The passivation layers are prevented from growing to an excessive amount. Therefore, the present invention may be applied to the evaluation of a semiconductor device having a minute pattern.

It is therefore an object of the present invention to establish a method of evaluating a defect and a dielectric breakdown voltage failure portion in a thin film for a semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of a semiconductor device to be evaluated according to a first preferred embodiment of the present invention;

FIGS. 2 through 4 are cross-sectional views showing process steps of a method of evaluating an oxide film of the semiconductor device in sequential order according to the first preferred embodiment of the present invention;

DESCRIPTION OF THE PREFERRED EMBODIMENTS

First Preferred Embodiment

Figure 3:
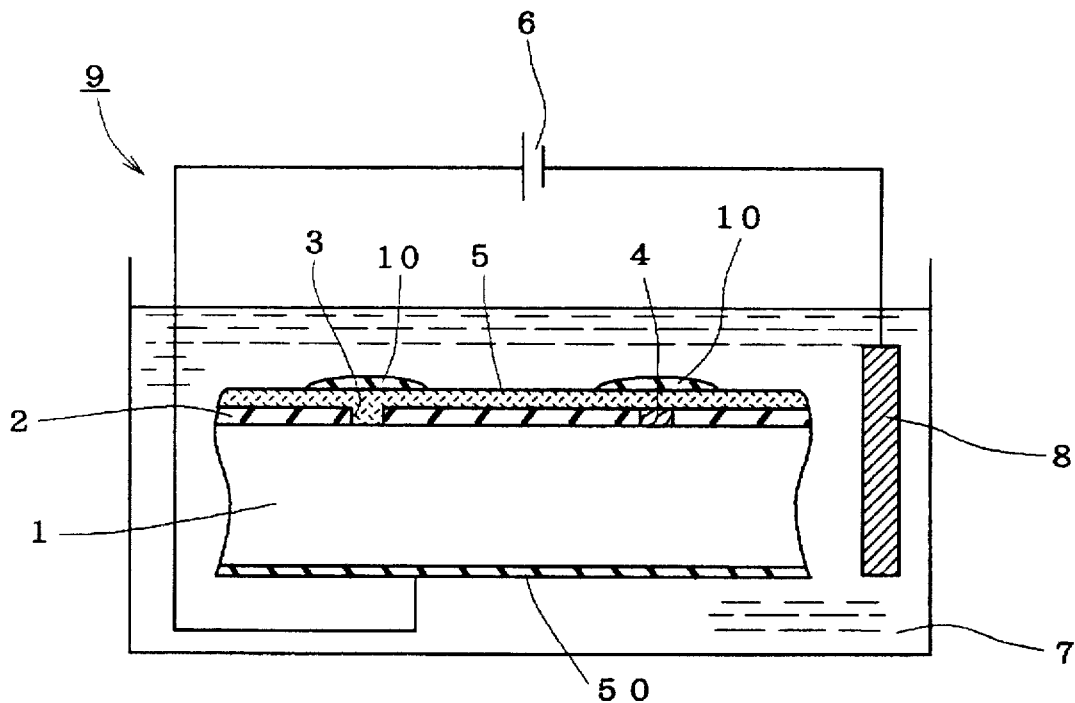

FIG. 1 shows a semiconductor device 100 to be evaluated. The semiconductor device 100 comprises a gate oxide film 2 formed on a silicon substrate 1, and a polysilicon film 5 formed on the gate oxide film 2. As described in the description of the background art, the gate oxide film 2 has a defect 3 and a dielectric breakdown voltage failure portion 4.

Figure 4:
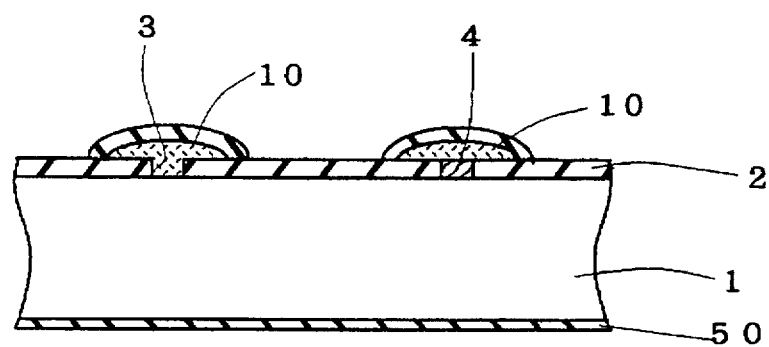

FIGS. 2 through 4 are cross-sectional views showing process steps of the first preferred embodiment in sequential order according to the present invention.

Referring to FIG. 2, the semiconductor device 100 is immersed in a chemical etchant 7 in a wet etching apparatus 9. The wet etching apparatus 9 comprises a ground electrode 8 to be immersed in the chemical etchant 7, and a DC voltage source 6 having a negative electrode connected to the ground electrode 8 and a positive electrode connected to the silicon substrate 1 of the semiconductor device 100. Chemical etching is performed with a DC voltage applied to the silicon substrate 1. The chemical etchant 7 typically includes an alkaline solution such as KOH, NaOH, LiOH, CsOH, NH$_4$OH, ethylenediamine pyrocatechol, hydrazine, and choline. Hydrazine (N$_2$H$_4$) itself has no hydroxyl group but generates a hydroxyl group in an aqueous solution as follows.

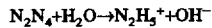

For example, 5N KOH raised to a temperature of 60° C. may be used as the chemical etchant 7.

When the DC voltage source 6 applies voltage to the silicon substrate 1, the polysilicon film 5 on the defect 3 is at the same potential as the substrate 1, and the potential is also applied to the polysilicon film 5 on the dielectric breakdown voltage failure portion 4. Then, as shown in FIG. 3, a passivation layer 50 is formed on a surface of the silicon substrate 1 which contacts the chemical etchant 7, and passivation layers 10 are formed on parts of a surface of the polysilicon film 5 which overlies the defect 3 and the dielectric breakdown voltage failure portion 4 because of anodic oxidation. The magnitude of the DC voltage may be controlled so that the passivation layers 10 are not formed on parts of the surface of the polysilicon film 5 which are insulated by the gate oxide film 2 and opposed to the silicon substrate 1 with the gate oxide film 2 therebetween. The polysilicon film 5 in the regions on which the passivation layers 10 are not formed is chemically etched by the chemical etchant 7. This etching process is performed in parallel with the formation of the passivation layers 10. Thus, the polysilicon film 5 remains unremoved only on the defect 3 and the dielectric breakdown voltage failure portion 4 as illustrated in FIG. 4.

The formation and the removal of the passivation layers 10 by chemical etching are described below. Oxidation of polysilicon forming the silicon substrate 1 in an alkaline solution is as follows.

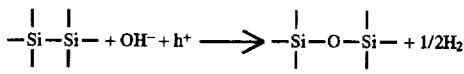

Thus the passivation layers 10 made of silicon oxide are formed. In parallel with the oxidation, a silicon compound is etched as follows.

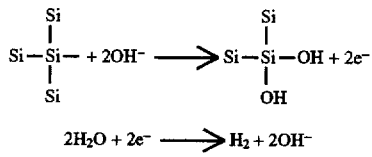

Etching reaction of silicon oxide is considered to occur in a similar manner. In particular, when KOH is used as the chemical etchant 7, the following reaction occurs:

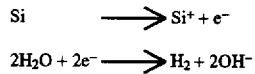

Etching of silicon is represented by:

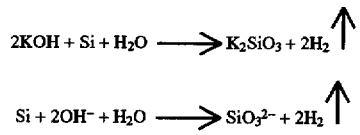

It will be understood from the above described chemical formulas that a hydroxyl group is involved in both of the formation and removal of the passivation layers 10.

In this fashion, the electric conductivity of both of the defect 3 and the dielectric breakdown voltage failure portion 4 is utilized to form the passivation layers 10 thereon, and the polysilicon film 5 in the regions on which the passivation layers 10 are not formed is chemically etched away by using the chemical etchant 7. This allows the evaluation of the dielectric breakdown voltage failure portion 4 as well as the defect 3.

Since the amount of the passivation layers 10 to be formed differs depending on the amount of leakage current, the amount of leakage current may be estimated to evaluate the defect 3 and the dielectric breakdown voltage failure portion 4. In the first preferred embodiment, the process for forming the passivation layers 10 and the etching of the polysilicon film 5 in the regions on which the passivation layers 10 are not formed by alkali are performed simultaneously, achieving simple and quick evaluation.

Second Preferred Embodiment

Figure 5:
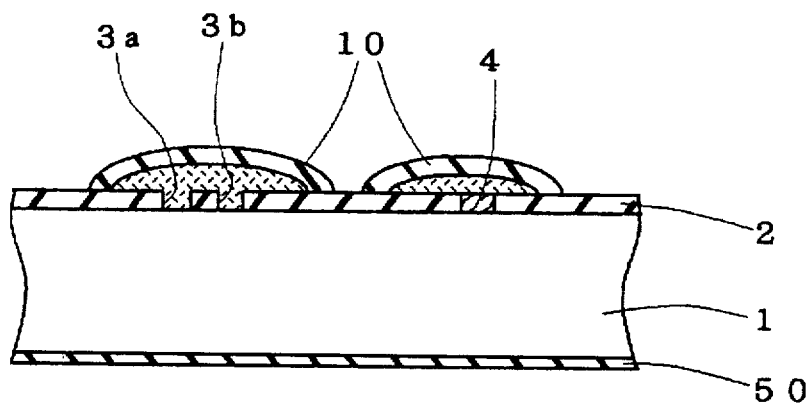
FIG. 5 is a cross-sectional view of an example of the semiconductor device subjected to the method of evaluating the oxide film of the semiconductor device according to the first preferred embodiment of the present invention.

The method of the first preferred embodiment sometimes fails to correctly evaluate the defect 3 and the dielectric breakdown voltage failure portion 4 which are in close proximity to each other. FIG. 5 shows defects 3a and 3b positioned adjacent to each other. Since the formation of the passivation layers 10 by the effect of current flowing from the defects 3a and 3b prevails against the etching of the polysilicon film 5 in a region sandwiched between the defects 3a and 3b by the chemical etchant 7, the single passivation layer 10 is formed over the defects 3a and 3b.

Figure 6:
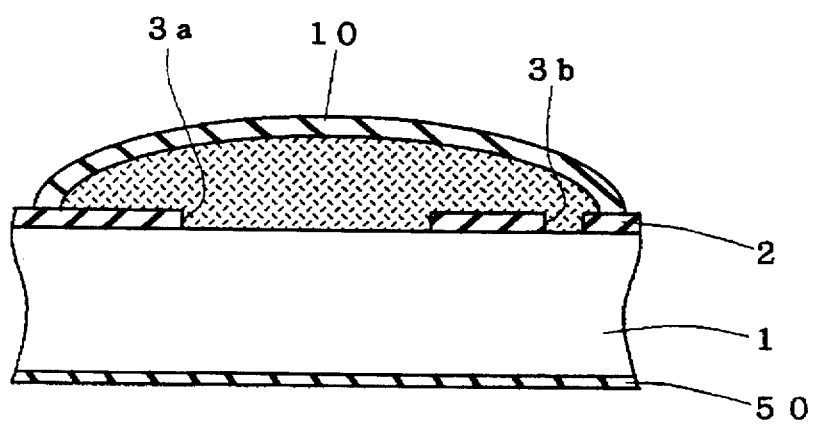
FIG. 6 is a cross-sectional view of another example of the semiconductor device subjected to the method of evaluating the oxide film of the semiconductor device according to the first preferred embodiment of the present invention.

Referring to FIG. 6, an increased leakage current from the relatively large defect 3a accelerates the formation of the passivation layer 10, resulting in the likelihood of formation of the single passivation layer 10 over the defects 3a and 3b which are not close to each other.

In these cases, the two defects 3a and 3b are evaluated as one defect. The second preferred embodiment provides the technique of accurately evaluating failures also in these cases.

Figure 7:
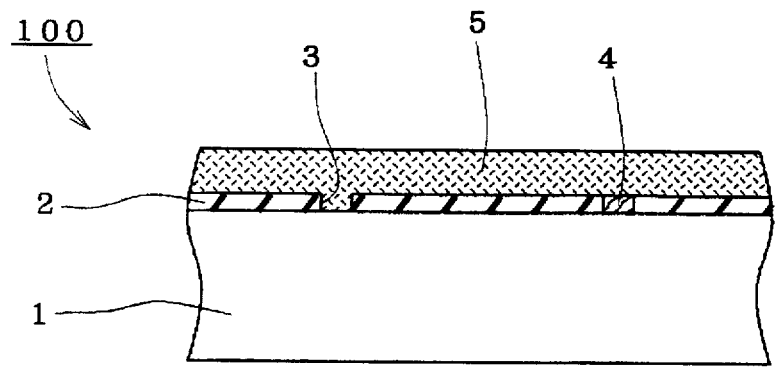
FIG. 7 is a cross-sectional view of the semiconductor device to be evaluated according to a second preferred embodiment of the present invention.

FIG. 7 illustrates the semiconductor device 100 to be evaluated according to the second preferred embodiment of the present invention. Elements of the second preferred embodiment identical with those of FIG. 1 are designated by the same reference numerals and characters, and the description thereof is dispensed with.

Figure 8:
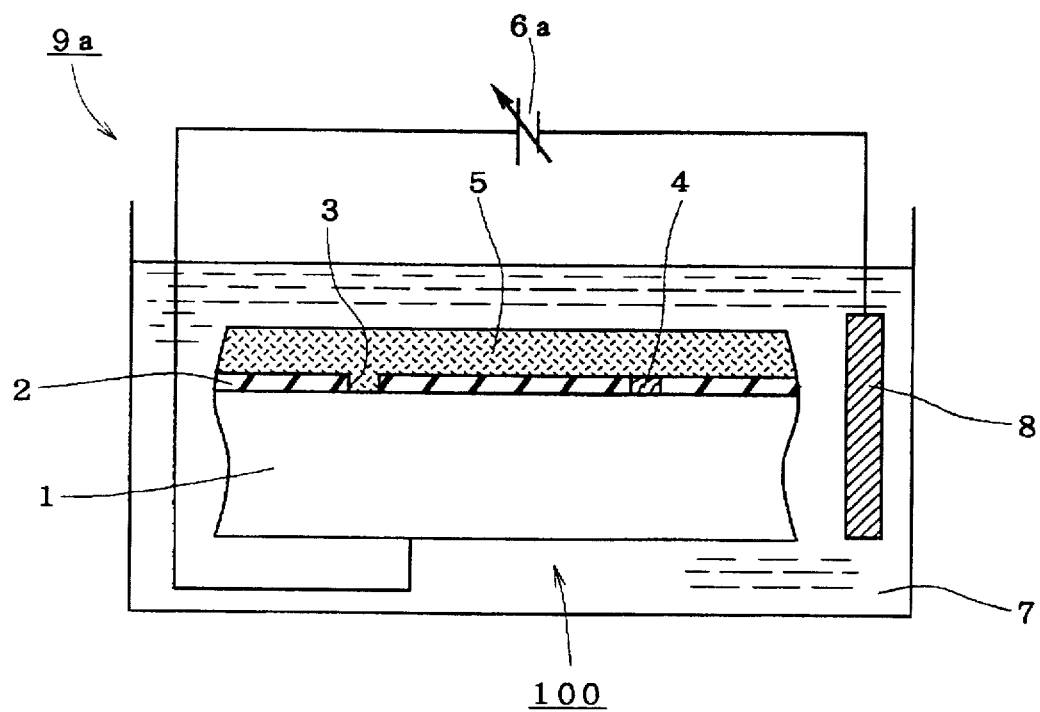
FIGS. 8 through 10 are cross-sectional views showing process steps of the method of evaluating the oxide film of the semiconductor device in sequential order according to the second preferred embodiment of the present invention.
Figure 9:
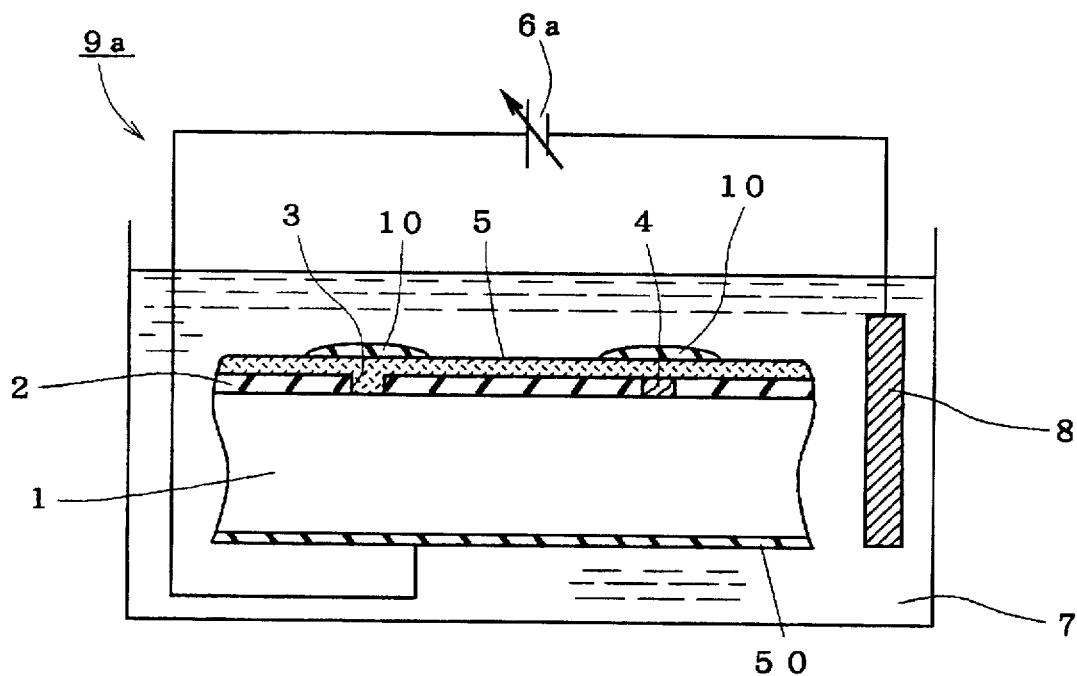
Figure 10:
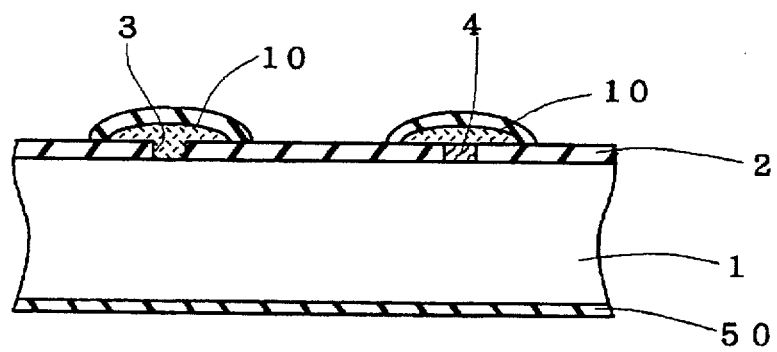

FIGS. 8 through 10 are cross-sectional views showing the process steps of the method of evaluating the oxide film of the semiconductor device in sequential order according to the second preferred embodiment of the present invention.

Referring to FIG. 8, the semiconductor device 100 is immersed in the chemical etchant 7 in a wet etching apparatus 9a. The wet etching apparatus 9a comprises a pulse voltage source 6a in place of the DC voltage source 6 of the wet etching apparatus 9 of the first preferred embodiment. The pulse voltage source 6a, similar to the DC voltage source 6, is connected to the ground electrode 8 and the silicon substrate 1. The pulse voltage source 6a alternately generates a high voltage and a low voltage which is lower than the high voltage. In the same manner as in the first preferred embodiment, 5N KOH raised to a temperature of 60° C. may be used as the chemical etchant 7.

When the pulse voltage source 6a applies voltage to the silicon substrate 1, the polysilicon film 5 on the defect 3 is at the same potential as the substrate 1, and the potential is also applied to the polysilicon film 5 on the dielectric breakdown voltage failure portion 4. Then, as shown in FIG. 9, the passivation layers 10 are formed on the parts of the surface of the polysilicon film 5 which overlies the defect 3 and the dielectric breakdown voltage failure portion 4 because of anodic oxidation, and the passivation layer 50 is formed on the surface of the silicon substrate 1. The magnitude of the high pulse voltage may be controlled so that the passivation layers 10 are not formed on the parts of the surface of the polysilicon film 5 which are insulated by the gate oxide film 2 and opposed to the silicon substrate 1 with the gate oxide film 2 therebetween. The polysilicon film 5 in the regions on which the passivation layers 10 are not formed is chemically etched by the chemical etchant 7 in parallel with the voltage application. Thus, the polysilicon film 5 remains unremoved only on the defect 3 and the dielectric breakdown voltage failure portion 4 as illustrated in FIG. 10.

The amount of the passivation layers 10 to be formed is greater than the amount of the passivation layers 10 to be removed by chemical etching when the high pulse voltage is applied, and the former is less than the latter when the low pulse voltage is applied. Thus, the passivation layers 10 repeatedly grow and shrink, prevented from reaching an excessive amount. Further, adjustment of a pulse width duty cycle brings the growth and shrinkage of the passivation layers 10 into balance, permitting control over the size of the passivation layers 10. For a balanced condition, the pulse width duty cycle is preferably not more than 50%.

The applied voltage is the pulse voltage in the second preferred embodiment. To prevent the excessive growth of the passivation layers 10, the voltage should be varied to change the growing rate of the passivation layers 10. Thus, the application of not only the pulse voltage but also a varying voltage to the silicon substrate 1 is included in the spirit of the present invention. A voltage source may periodically vary the voltage to readily provide the effects of the second preferred embodiment.

Figure 11:
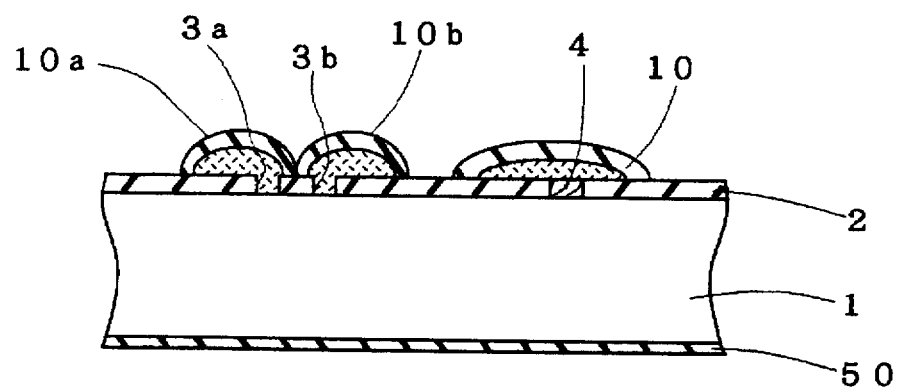
FIG. 11 is a cross-sectional view of an example of the semiconductor device subjected to the method of evaluating the oxide film of the semiconductor device according to the second preferred embodiment of the present invention.
Figure 12:
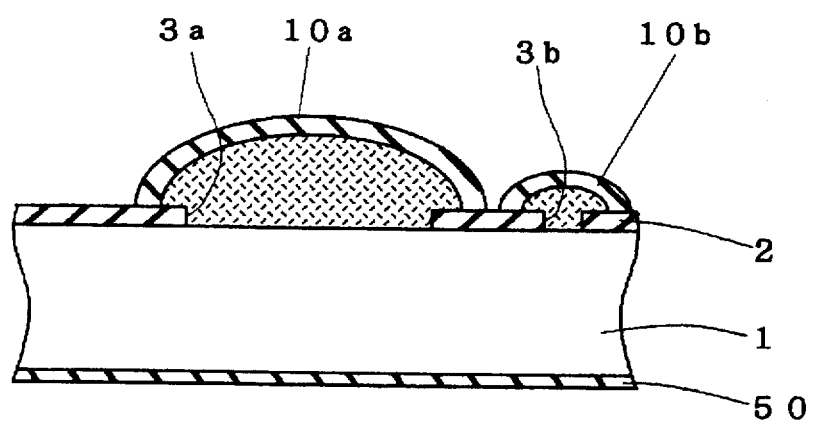
FIG. 12 is a cross-sectional view of another example of the semiconductor device subjected to the method of evaluating the oxide film of the semiconductor device according to the second preferred embodiment of the present invention.

The application of the DC voltage as described in the first preferred embodiment might form an excessive amount of the passivation layers 10 to cause the disadvantages shown in FIGS. 5 and 6 during evaluation. The second preferred embodiment, however, provides a suitable amount of the passivation layers 10 formed on the individual defect 3 and the individual dielectric breakdown voltage failure portion 4. FIGS. 11 and 12 show passivation layers 10a and 10b formed on the defects 3a and 3b, respectively. The second preferred embodiment allows proper evaluation of the size and the position of the defect 3 and the dielectric breakdown voltage failure portion 4.

In the second preferred embodiment, the pulse voltage is used for anodic oxidation, permitting control over the amount of the passivation layers 10 formed on the defect 3 and the dielectric breakdown voltage failure portion 4. Therefore, the method of evaluation according to the second preferred embodiment is effective when the defect 3 and the dielectric breakdown voltage failure portion 4 are large in size or positioned close to each other.

Also in the second preferred embodiment, the process for forming the passivation layers 10 and the etching of the polysilicon film 5 in the regions on which the passivation layers 10 are not formed by alkali can be performed simultaneously in the same manner as in the first preferred embodiment, achieving simple and quick evaluation.

Example 1

Figure 13:
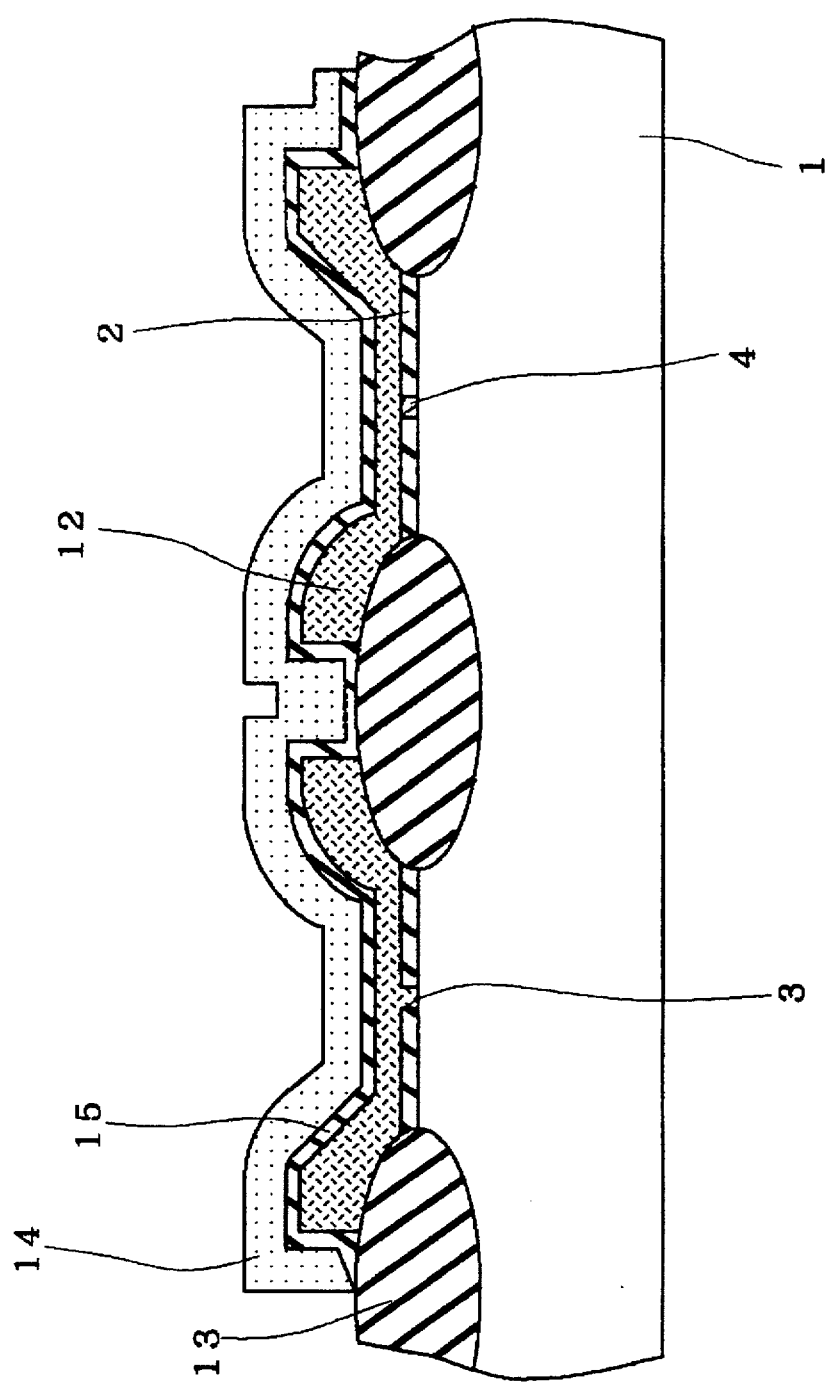
FIG. 13 is a cross-sectional view of an EEPROM to be evaluated according to a first example of the present invention.

FIG. 13 shows an EEPROM to be evaluated according to a first example of the present invention. Like reference numerals and characters are used to designate elements identical with those of FIG. 1. The EEPROM comprises device isolation oxide films 13 formed on the silicon substrate 1, a gate oxide film 2, floating gate electrodes 12 consisting of a polysilicon film, a gate insulating film 15, and a control gate electrode 14 consist of a polysilicon film. The gate oxide film 2 has the defect 3 and the dielectric breakdown voltage failure portion 4.

Figure 14:
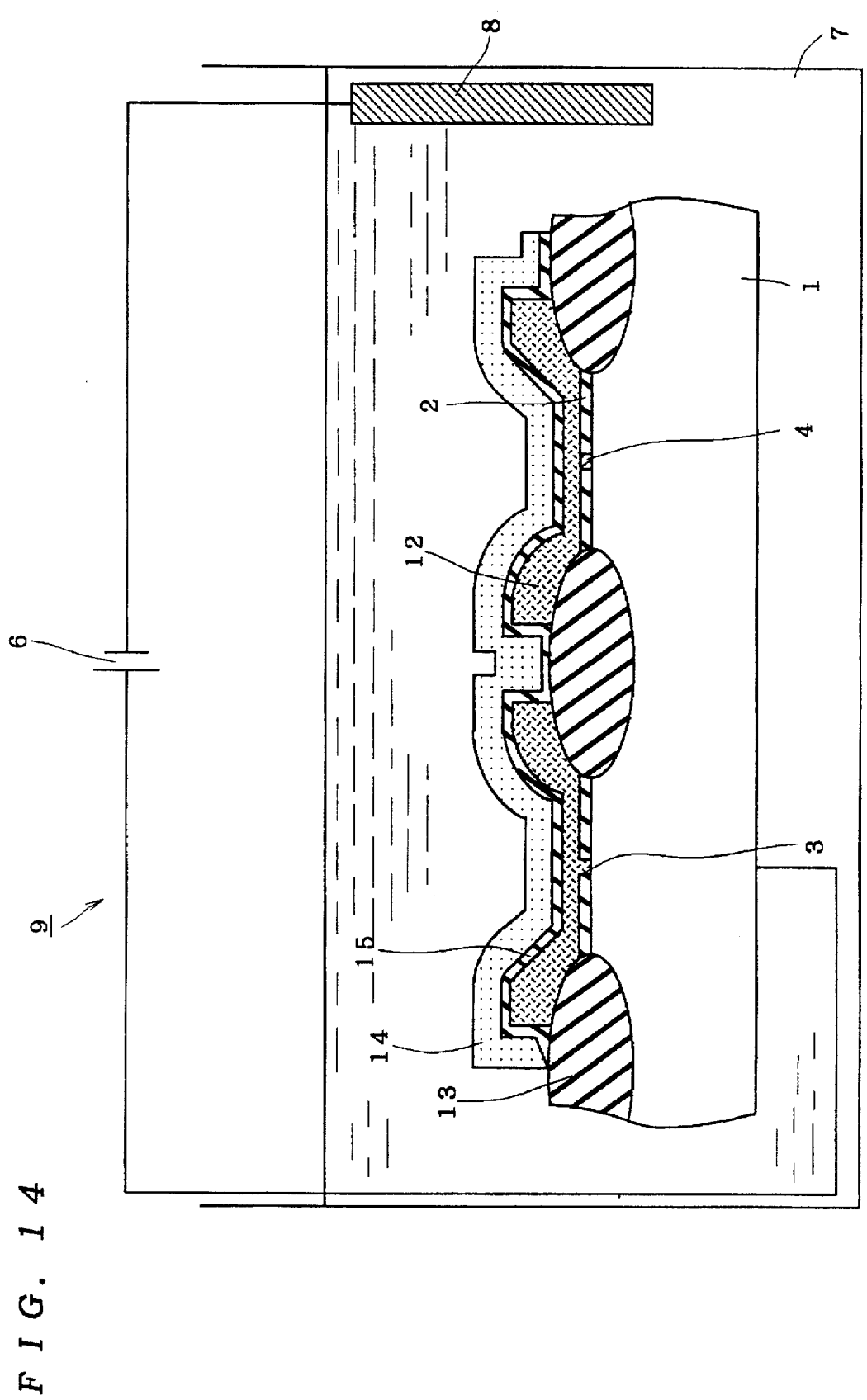
FIGS. 14 and 15 are cross-sectional views showing process steps of a method of evaluating a gate oxide film of the EEPROM in sequential order according to the first example of the present invention.
Figure 15:
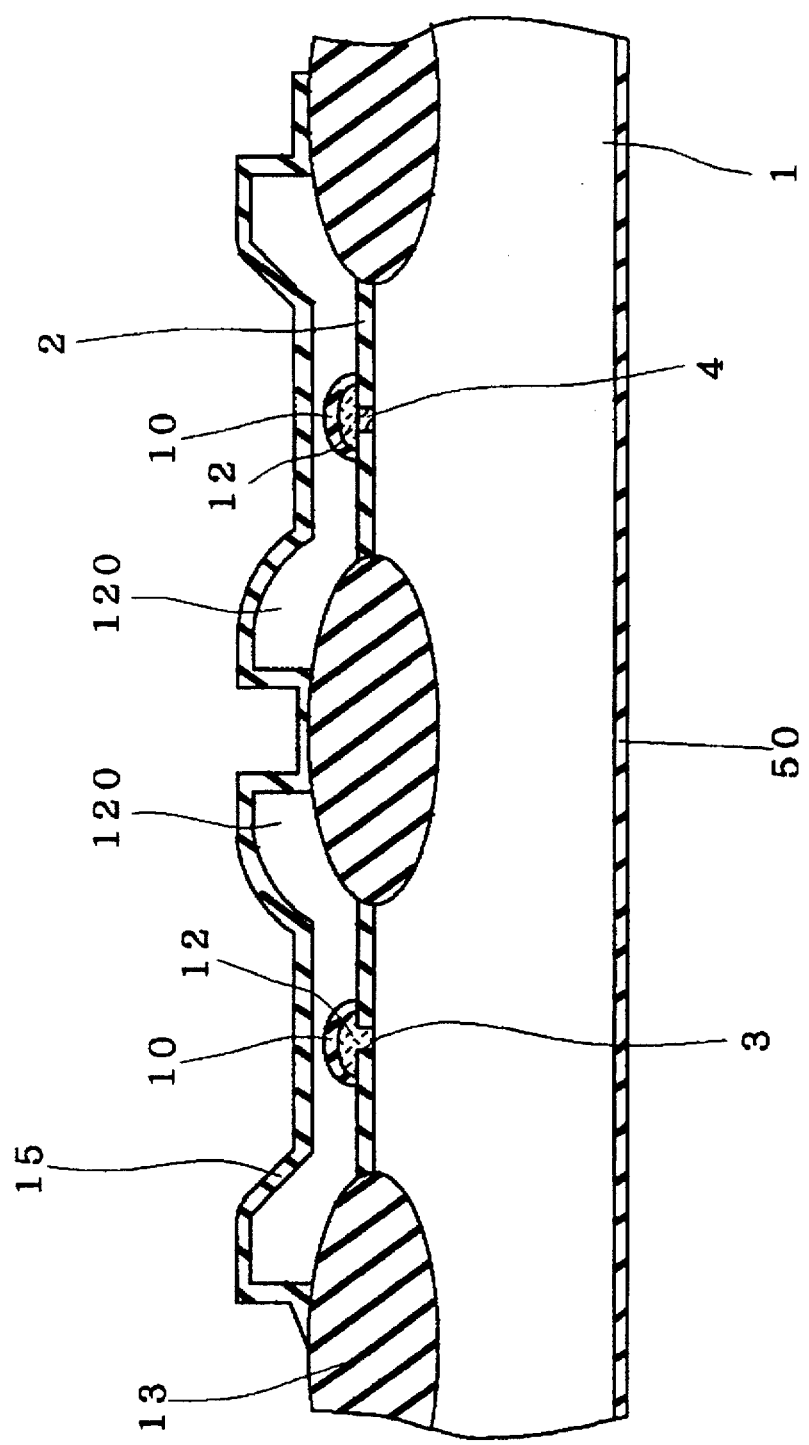

FIGS. 14 and 15 are cross-sectional views sequentially showing the process steps of evaluation of the gate oxide film of an EEPROM (Electrically Erasable and Programmable Read Only Memory), one of non volatile semiconductor memory devices, which can electrically write and erase information according to the first example of the present invention.

The wet etching apparatus 9 of the first preferred embodiment is used to chemically etch the EEPROM, as shown in FIG. 14, with the DC voltage applied to the silicon substrate 1. As the chemical etchant 7, 5N KOH raised to a temperature of 60° C. may be used. Then, a DC voltage of several to tens of volts is applied to the silicon substrate 1 to form the passivation layers 10 only in regions of the polysilicon film of the floating gate electrodes 12 which overlies the defect 3 and the dielectric breakdown voltage failure portion 4.

As shown in FIG. 15, the passivation layers 10 are not formed on the polysilicon film of the control gate electrode 14 and the polysilicon film of the floating gate electrodes 12 in regions insulated by the gate oxide film 2 which are at a lower potential than the silicon substrate 1. Since the control gate electrode 14 and the gate insulating film 15 do not continuously extend in a direction perpendicular to the plane of the drawings, the polysilicon film of the floating gate electrodes 12 in the regions on which the passivation layers 10 are not formed, as well as the polysilicon film of the control gate electrode 14, is etched by alkali using the chemical etchant 7 and removed, and hollows 120 are formed. The silicon substrate 1 on which the passivation layer 50 is formed and parts of the polysilicon film of the floating gate electrodes 12 which overlies the defect 3 and the dielectric breakdown voltage failure portion 4 and have the passivation layers 10 formed thereon are not chemically etched by the chemical etchant 7. The device isolation oxide films 13 and gate insulating film 15 which have an etching rate by the chemical etchant 7 less than that of polysilicon remain unremoved.

Failures resulting from the gate oxide film 2 of the EEPROM which is one of the non volatile semiconductor memory devices are evaluated in the first example. The value of the DC voltage applied to the silicon substrate 1 may be greater than the value which allows the passivation layers 10 to be formed only on the polysilicon film in the regions overlying the defect 3 and the dielectric breakdown voltage failure portion 4 in the gate oxide film 2, thereby forming the passivation layers 10 on the polysilicon film overlying the defect 3 and the dielectric breakdown voltage failure portion 4 located in any position in the gate oxide film 2. Thus, the parts of the polysilicon film which overlies the defect 3 and the dielectric breakdown voltage failure portion 4 are not chemically etched but remain unremoved. This allows the evaluation of the presence or absence and position of the defect 3 and the dielectric breakdown voltage failure portion 4. Additionally, the process for forming the passivation layers 10 and the etching of the polysilicon films on which the passivation layers 10 are not formed by alkali can be performed simultaneously in the same manner as in the first preferred embodiment, achieving simple and quick evaluation.

Example 2

Figure 16:
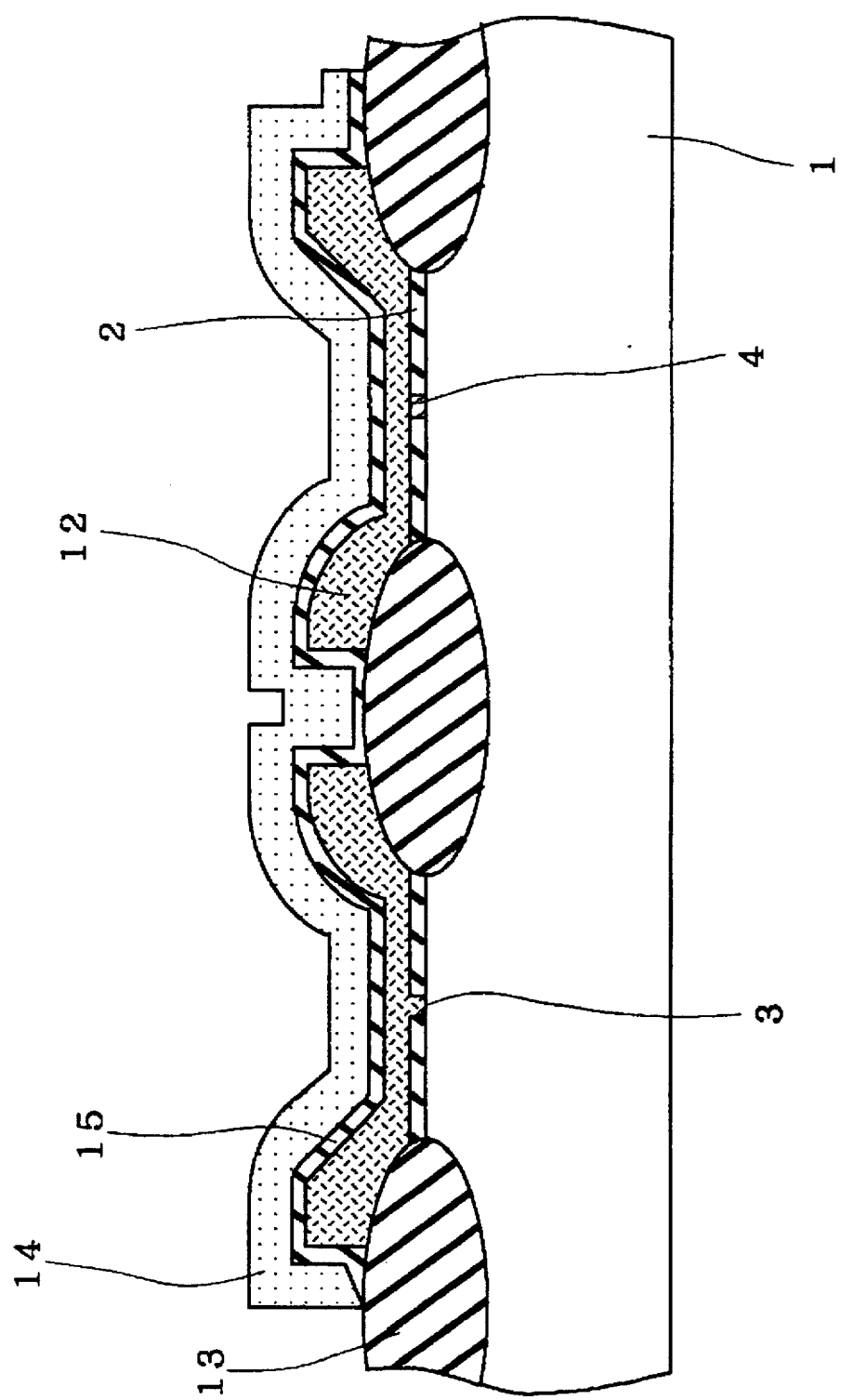
FIG. 16 is a cross-sectional view of the EEPROM to be evaluated according to a second example of the present invention.

FIG. 16 shows the EEPROM to be evaluated according to a second example of the present invention. Elements of the second example identical with those of FIG. 13 are designated by the same reference numerals and characters, with the description thereof dispensed with.

Figure 17:
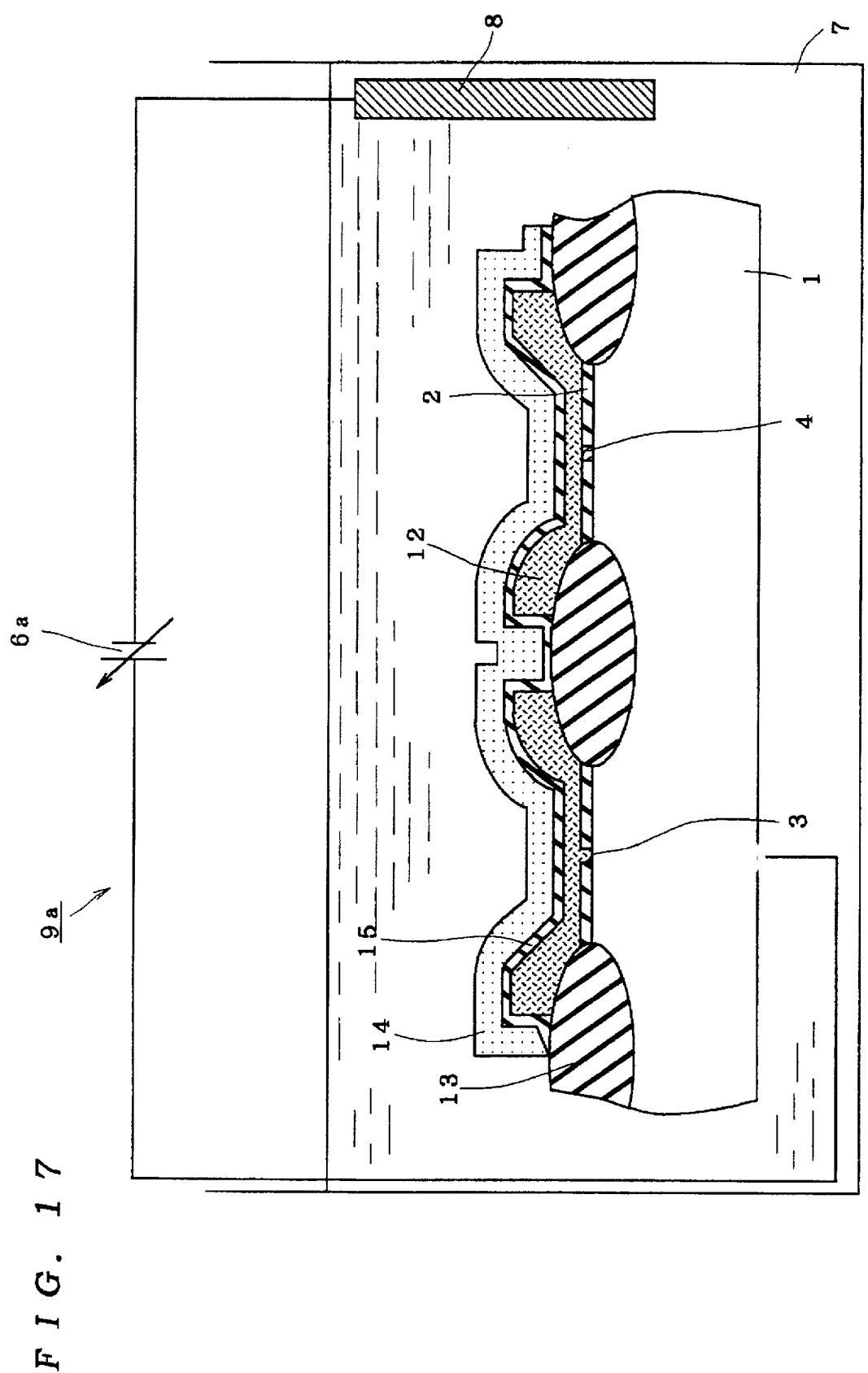
FIGS. 17 and 18 are cross-sectional views showing process steps of the method of evaluating the gate oxide film of the EEPROM in sequential order according to the second example of the present invention.
Figure 18:
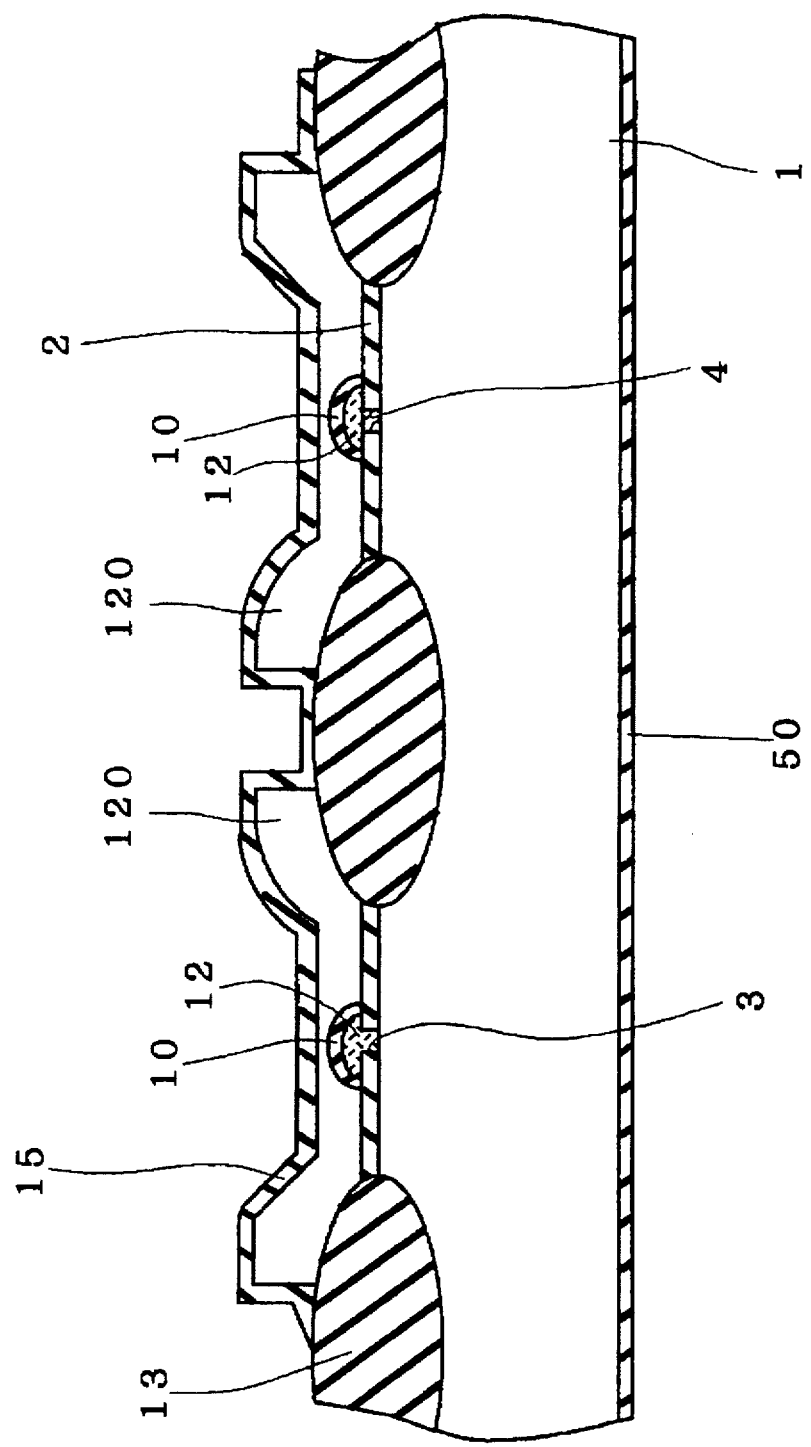

FIGS. 17 and 18 are cross-sectional views showing the process steps of evaluation of the gate oxide film of the EEPROM in sequential order according to the second example of the present invention.

Referring to FIG. 17, the EEPROM is immersed in the chemical etchant 7 in the wet etching apparatus 9a. The wet etching apparatus 9a of the second example is similar in constitution to that of the second preferred embodiment. The pulse voltage source 6a for alternately generating high and low voltages is connected to the ground electrode 8 and silicon substrate 1. As the chemical etchant 7, 5N KOH raised to a temperature of 60° C. may be used.

When 5N KOH raised to the temperature of 60° C. is used as the chemical etchant 7, the magnitude of the high pulse voltage such that the passivation layers 10 are formed by anodic oxidation on the parts of the surface of the polysilicon film of the floating gate electrodes 12 which overlies the defect 3 and the dielectric breakdown voltage failure portion 4 but are not formed on the parts of the surface of the polysilicon film of the floating gate electrodes 12 which are insulated by the gate oxide film 2 and opposed to the silicon substrate with the gate oxide film 2 therebetween is several to tens of volts. The passivation layers 10 are not formed on the polysilicon film of the control gate electrode 14 and the polysilicon film of the floating gate electrodes 12 in the regions insulated by the gate oxide film 2 which are at a lower potential than the silicon substrate 1. Since the control gate electrode 14 and the gate insulating film 15 do not continuously extend in the direction perpendicular to the plane of the drawings, the polysilicon film of the floating gate electrodes 12 in the regions on which the passivation layers 10 are not formed, as well as the polysilicon film of the control gate electrode 14, is etched away by the chemical etchant 7, and hollows 120 are formed. This etching process is performed in parallel with the voltage application. The polysilicon film of the floating gate electrodes 12 remains unremoved only in the regions overlying the defect 3 and the dielectric breakdown voltage failure portion 4. The device isolation oxide films 13 and gate insulating film 15 which have an etching rate by the chemical etchant 7 less than that of polysilicon remain unremoved.

The passivation layers 10 repeatedly grow and shrink in the same manner as in the second preferred embodiment, prevented from reaching an excessive amount. Adjustment of the pulse width duty cycle provides balanced growth and shrinkage of the passivation layers 10 to control the size of the passivation layers 10. For a balanced condition, the pulse width duty cycle is preferably not more than 50%.

With the DC voltage applied to the silicon substrate 1 as in the first example, the passivation layers 10 might grow excessively, resulting in the disadvantages of FIGS. 5 and 6 during evaluation. The method of the second example, however, provides a suitable amount of the passivation layers 10 formed on the individual defect 3 and dielectric breakdown voltage failure portion 4. For the same reasons as the second preferred embodiment, the size and the position of the defect 3 and the dielectric breakdown voltage failure portion 4 may be appropriately evaluated.

The pulse voltage is used for anodic oxidation in the second example to control the amount of the passivation layers 10 formed on the defect 3 and the dielectric breakdown voltage failure portion 4. Thus, the method of the second example is effective when the defect 3 and the dielectric breakdown voltage failure portion 4 are large in size or positioned adjacent to each other.

In the second example, similar to the first example, the process for forming the passivation layers 10 and the etching of the polysilicon film in the regions on which the passivation layers 10 are not formed by alkali may be performed simultaneously, achieving simple and quick evaluation. The value of the pulse voltage applied to the silicon substrate 1 may be greater than the value which permits the passivation layers 10 to be formed only on the polysilicon film in the regions overlying the defect 3 and the dielectric breakdown voltage failure portion 4 in the gate oxide film 2, thereby forming the passivation layers 10 on the polysilicon film overlying the defect 3 and the dielectric breakdown voltage failure portion 4 located in any position in the gate oxide film 2. Thus, the parts of the polysilicon film which overlies the defect 3 and the dielectric breakdown voltage failure portion 4 are not chemically etched but remain unremoved. This allows the evaluation of the presence or absence and position of the defect 3 and the dielectric breakdown voltage failure portion 4.

Example 3

Figure 19:
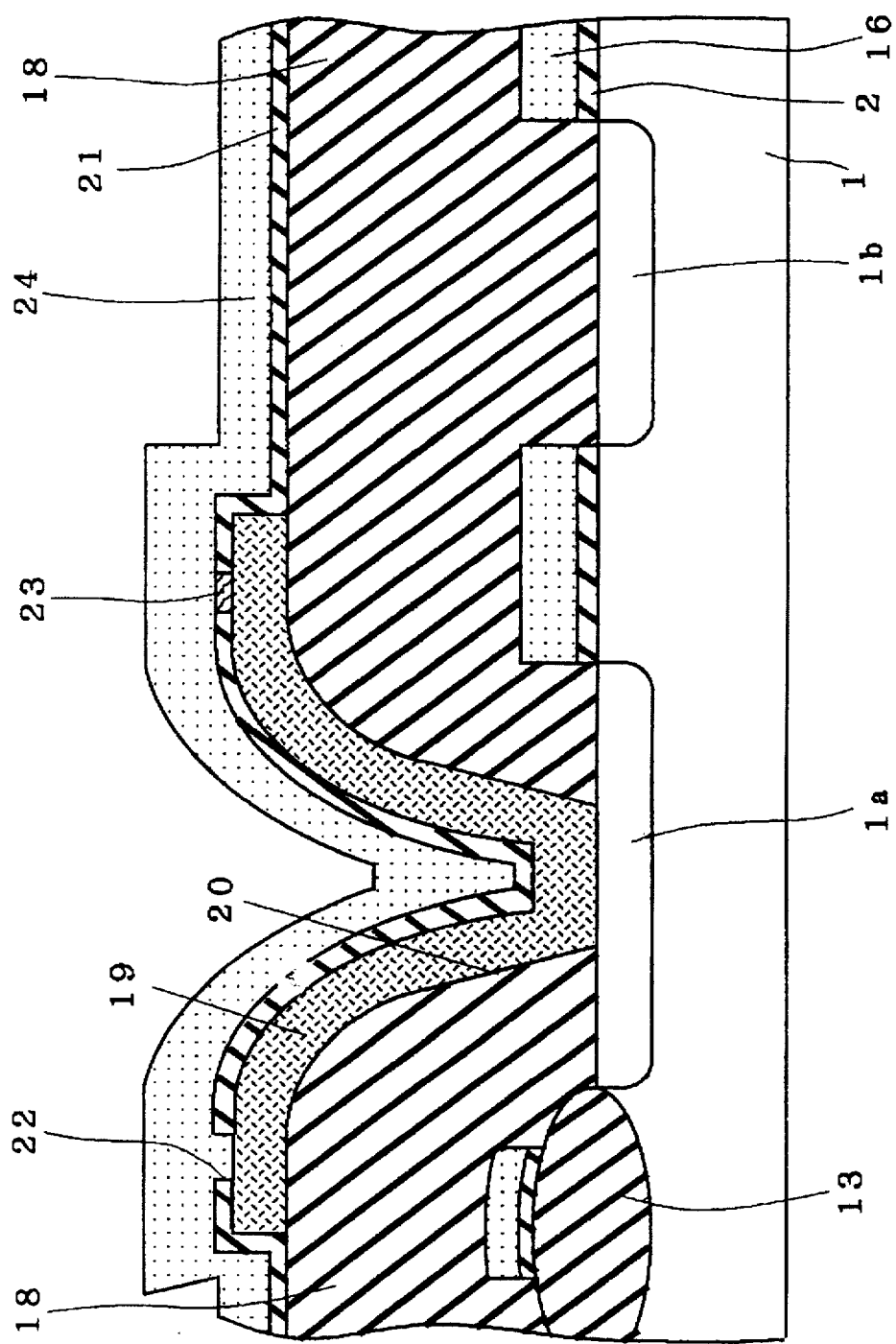
FIG. 19 is a cross-sectional view of a DRAM to be evaluated according to a third example of the present invention.

FIG. 19 illustrates a multilayer-capacitor type dynamic random access memory (DRAM) cell to be evaluated according to a third example of the present invention. Like reference numerals and characters are used to designate elements identical with those of the first example. The DRAM cell comprises a gate oxide film 2 formed on the silicon substrate 1, a device isolation oxide film 13, a gate electrode 16, $n^+$ impurity diffusion layers $1a$ and $1b$, an interlayer insulating films 18, a capacitor lower electrode 19 in the form of a polysilicon film, a capacitor dielectric film 21 in the form of an oxide film, and a capacitor upper electrode 24 in the form of a polysilicon film. The capacitor dielectric film 21 has a defect 22 and a dielectric breakdown voltage failure portion 23 resulting from a film quality anomaly. The interlayer insulating films 18 have openings 20 which exposes a part of the impurity diffusion layer $1a$.

Figure 20:
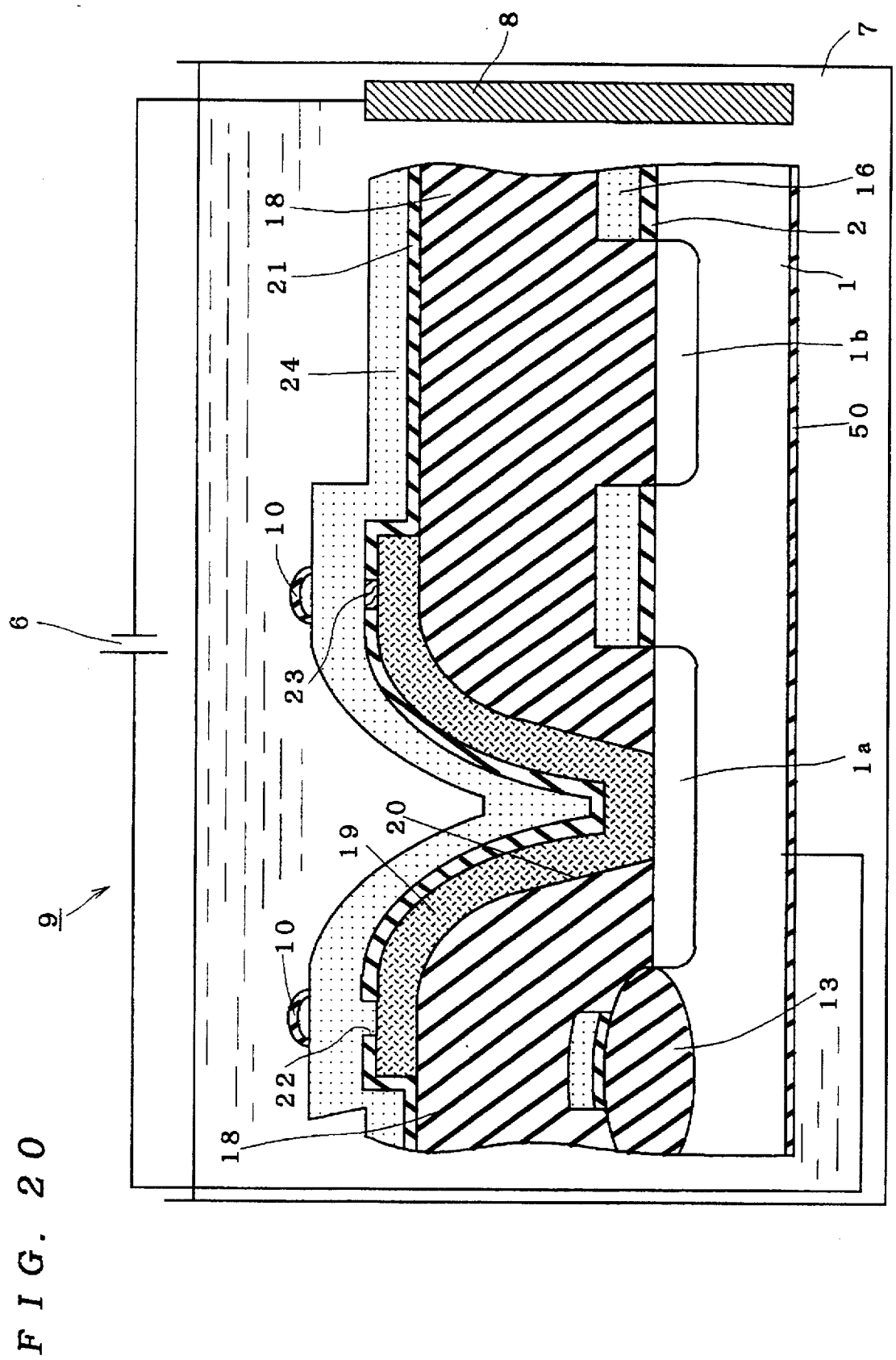
FIGS. 20 and 21 are cross-sectional views showing process steps of a method of evaluating a gate oxide film of the DRAM in sequential order according to the third example of the present invention.
Figure 21:
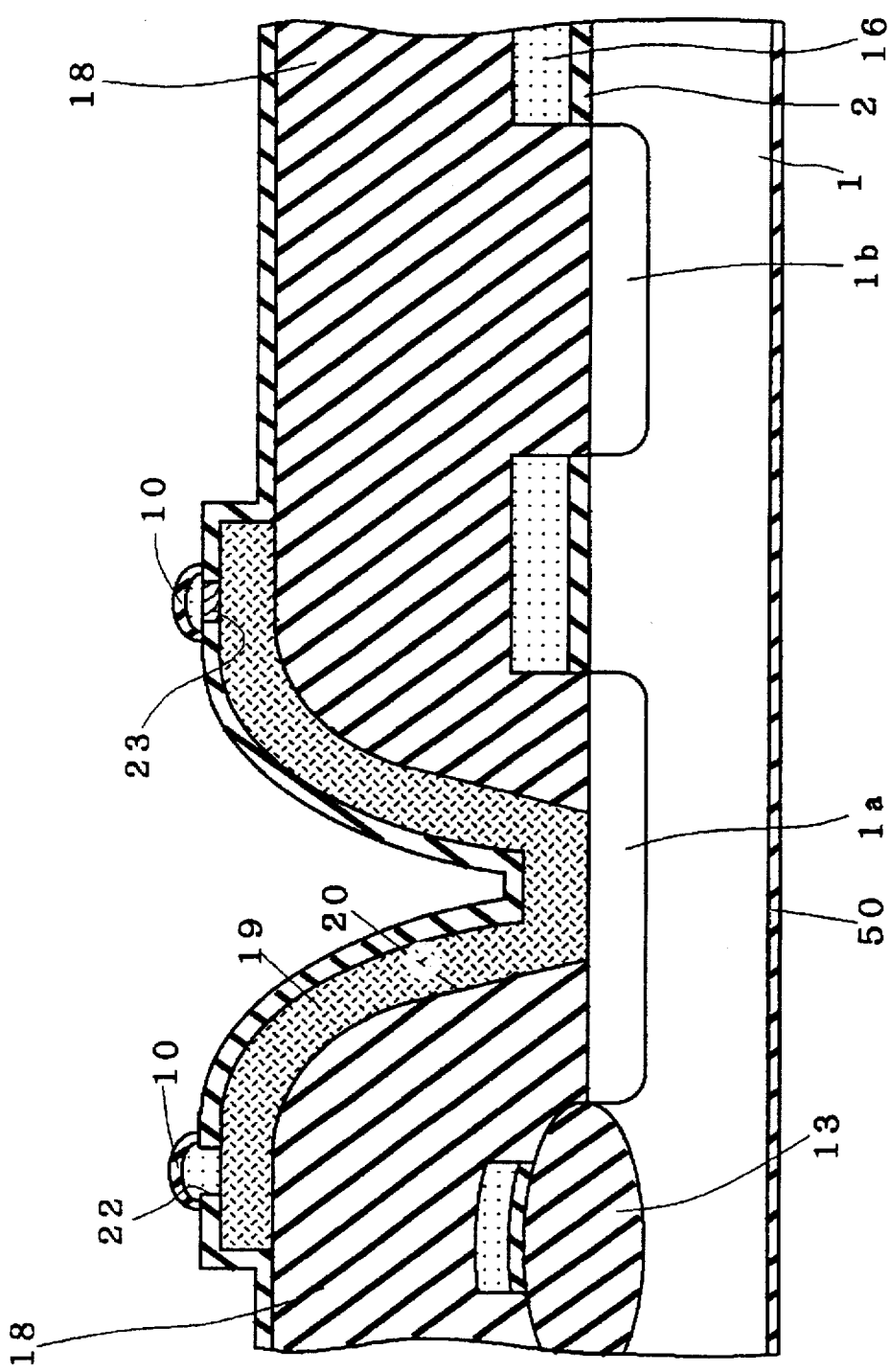

FIGS. 20 and 21 are cross-sectional views showing the process steps of evaluation of the capacitor dielectric film 21 of the DRAM cell of FIG. 19 in sequential order according to the third example of the present invention.

Referring to FIG. 20, the DRAM cell is chemically etched in the chemical etchant 7, with the DC voltage applied to the silicon substrate 1 by using the wet etching apparatus 9 including the DC voltage source 6 described in the first preferred embodiment. As the chemical etchant 7, 5N KOH raised to a temperature of 60° C. may be used.

When the DC voltage source 6 applies voltage to the silicon substrate 1, the capacitor upper electrode 24 on the defect 22 is at the same potential as the substrate 1, and the potential is also applied to the capacitor upper electrode 24 on the dielectric breakdown voltage failure portion 23. Then, as shown in FIG. 20, the passivation layers 10 are formed on parts of the surface of the capacitor upper electrode 24 which overlies the defect 22 and dielectric breakdown voltage failure portion 23 because of anodic oxidation, and the passivation layer 50 is formed on the surface of the silicon substrate 1 which contacts the chemical etchant 7. The magnitude of the DC voltage may be controlled so that the passivation layers 10 are not formed on parts of the surface of the capacitor upper electrode 24 which are insulated by the capacitor dielectric film 21 and opposed to the capacitor lower electrode 19, with the capacitor dielectric film 21 therebetween. The capacitor upper electrode 24 in the regions on which the passivation layers 10 are not formed is chemically etched by the chemical etchant 7. This etching process is performed in parallel with the formation of the passivation layers 10. Thus, as illustrated in FIG. 21, the polysilicon film of the capacitor upper electrode 24 remains only on the defect 22 and dielectric breakdown voltage failure portion 23.

The third example may evaluate a failure of the capacitor dielectric film 21 of the multilayer-capacitor type DRAM cell. The value of the DC voltage applied to the silicon substrate 1 may be greater than the value which permits the passivation layers 10 to be formed only on the polysilicon film in the regions overlying the defect 22 and dielectric breakdown voltage failure portion 23 in the capacitor dielectric film 21, thereby enabling to form the passivation layers 10 on the polysilicon film in a wide area on the capacitor dielectric film 21 having the defect 22 and dielectric breakdown voltage failure portion 23. The parts of the polysilicon film which overlies the defect 22 and dielectric breakdown voltage failure portion 23 are not chemically etched but remain unremoved. This allows the evaluation of the presence or absence and position of the defect 22 and dielectric breakdown voltage failure portion 23. Additionally, the process for forming the passivation layers 10 and the etching of the polysilicon films on which the passivation layers 10 are not formed by alkali can be performed simultaneously in the third example, achieving simple and quick evaluation.

Example 4

Figure 22:
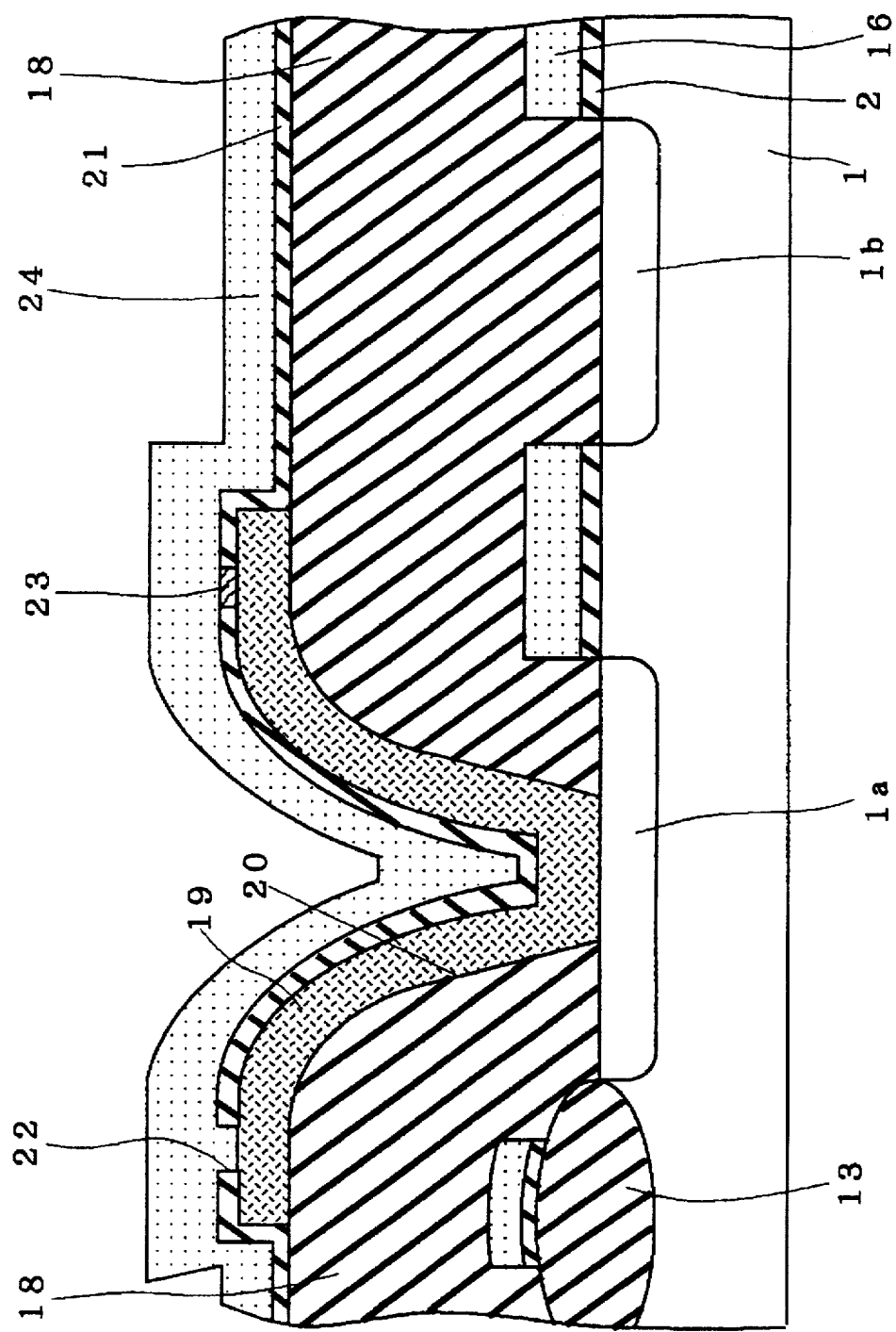
FIG. 22 is a cross-sectional view of the DRAM to be evaluated according to a fourth example of the present invention.

FIG. 22 shows the DRAM cell to be evaluated according to a fourth example of the present invention. Elements of the fourth example identical with those of FIG. 19 are designated by the same reference numerals and characters, with the description thereof dispensed with.

Figure 23:
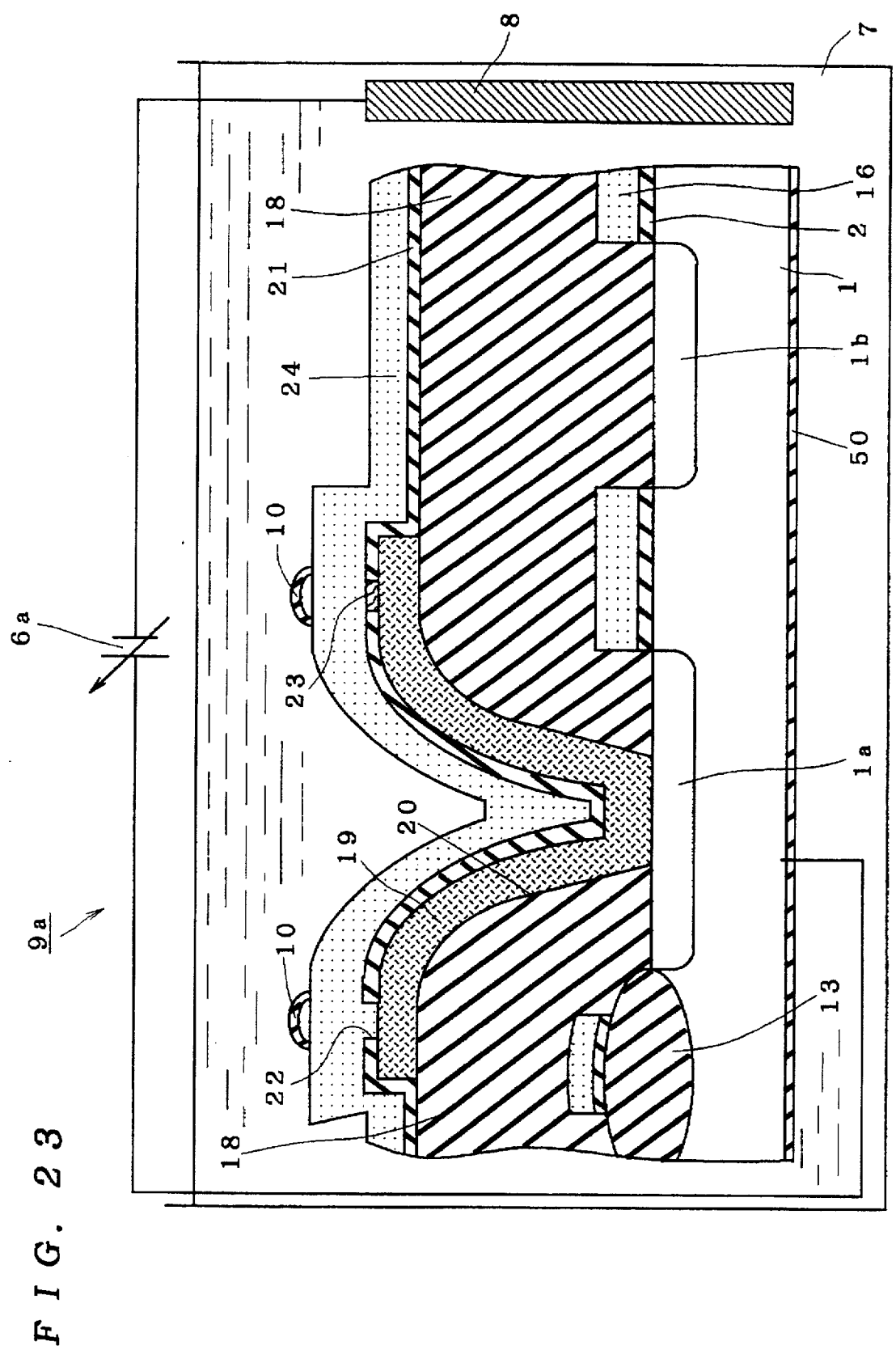
FIGS. 23 and 24 are cross-sectional views showing process steps of the method of evaluating the gate oxide film of the DRAM in sequential order according to the fourth example of the present invention.
Figure 24:
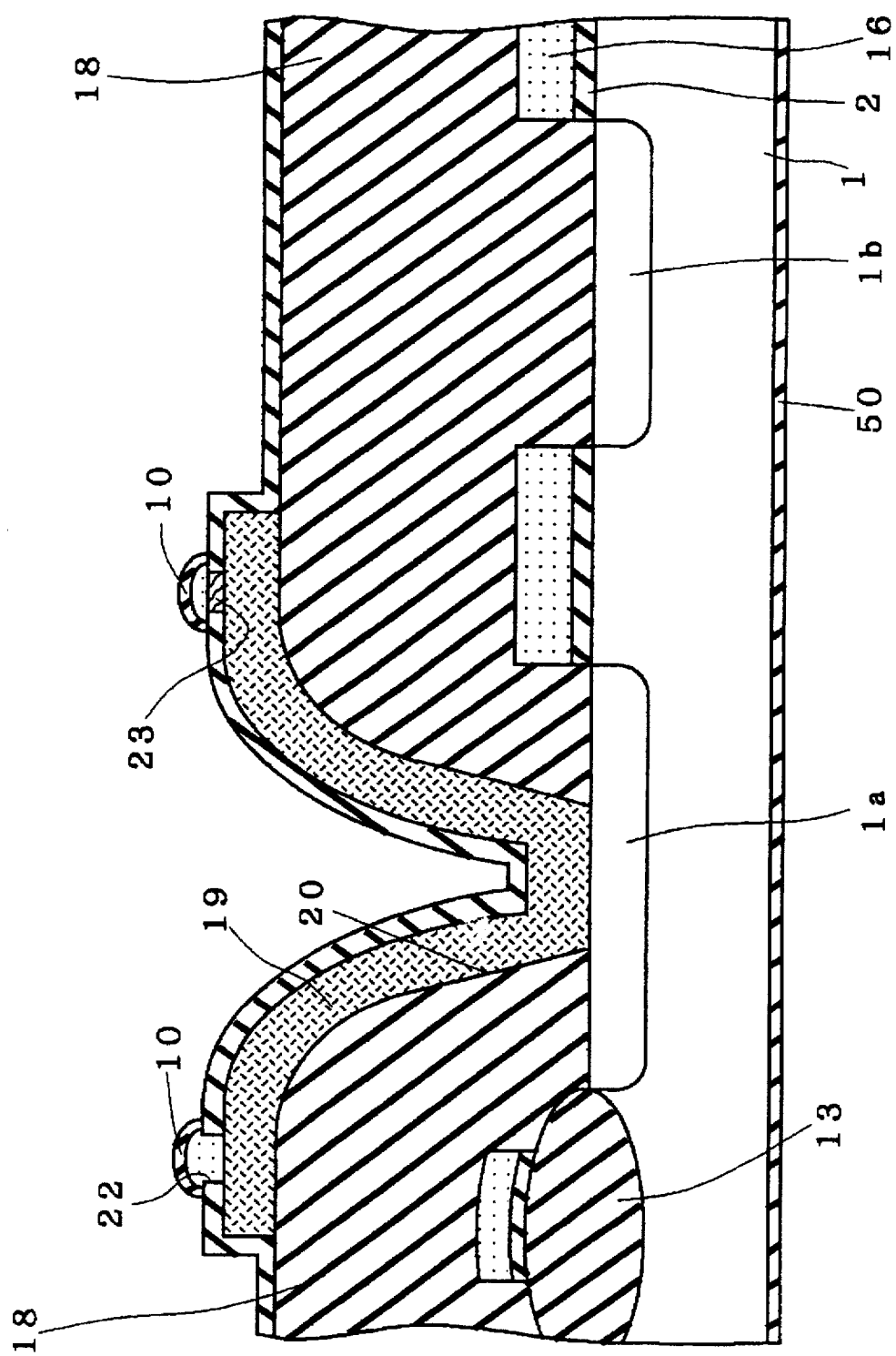
Figure 25:
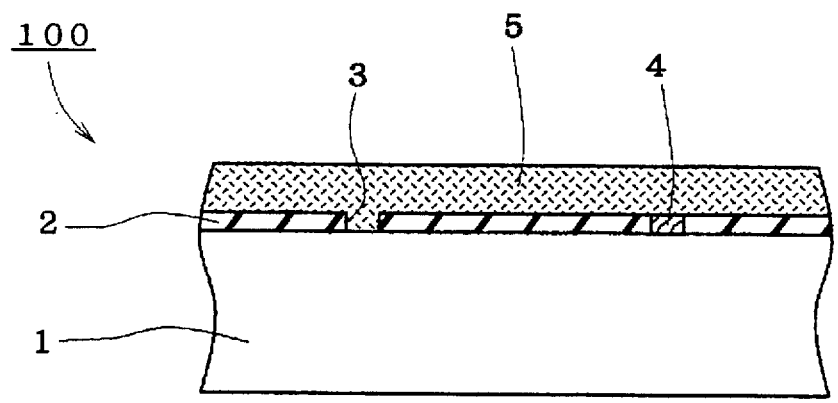
FIGS. 25 through 27 are cross-sectional views showing process steps of a conventional method of evaluating a gate oxide film in sequential order.
Figure 26:
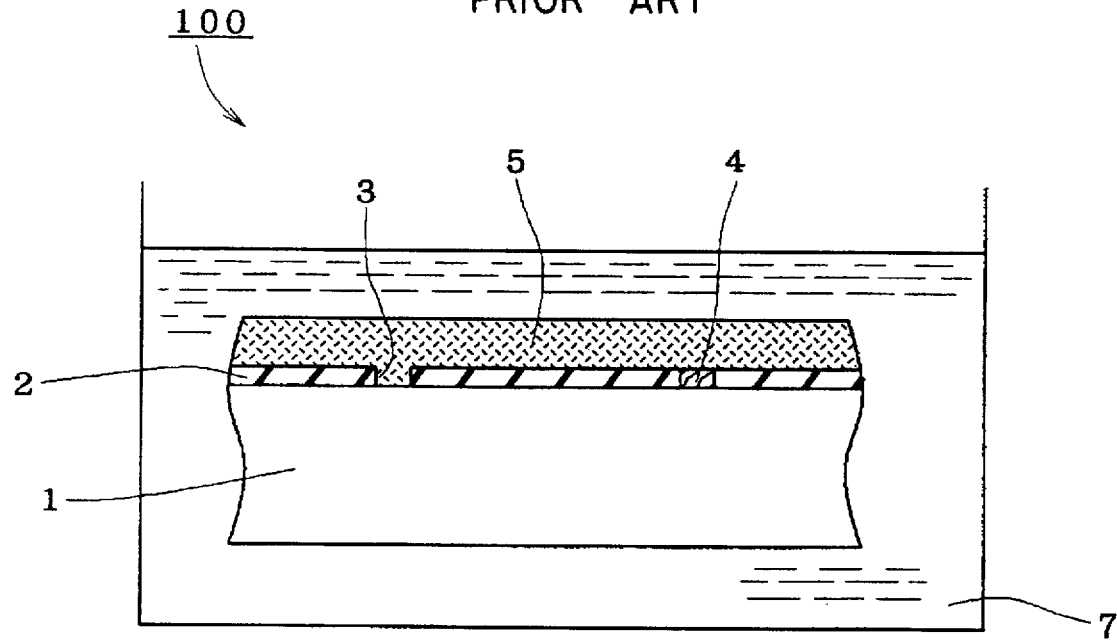
Figure 27:
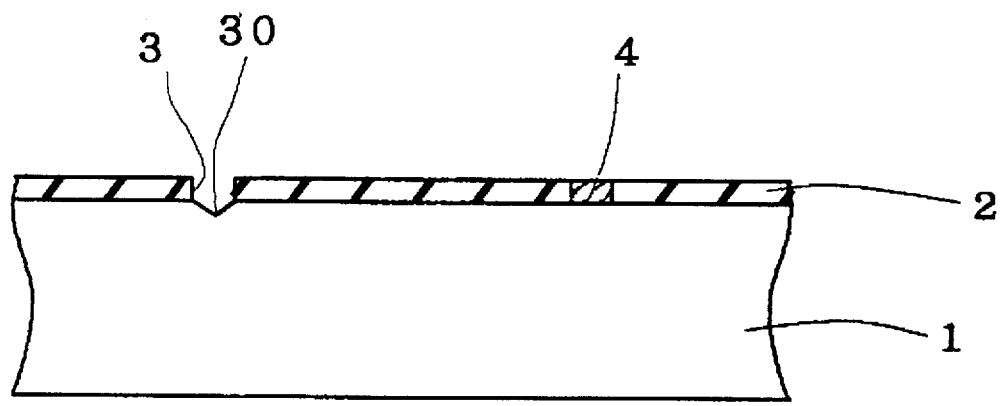

FIGS. 23 and 24 are cross-sectional views of the process steps of evaluation of the capacitor dielectric film 21 of the multilayer-capacitor type DRAM cell in sequential order according to the fourth example of the present invention.

Referring to FIG. 23, the DRAM cell is immersed in the chemical etchant 7 in the wet etching apparatus 9a. The wet etching apparatus 9a of the fourth example is identical in constitution with that of the second preferred embodiment. The DRAM cell is chemically etched in the chemical etchant 7 as shown in FIG. 23 using the pulse voltage source 6a for alternately generating high and low voltages. As the chemical etchant 7, 5N KOH raised to a temperature of 60° C. may be used.

When the pulse voltage source 6a applies voltage to the silicon substrate 1, the capacitor upper electrode 24 on the defect 22 is at the same potential as the substrate 1, and the potential is also applied to the capacitor upper electrode 24 on the dielectric breakdown voltage failure portion 23. Then, as shown in FIG. 23, the passivation layers 10 are formed on the parts of the surface of the capacitor upper electrode 24 which overlies the defect 22 and dielectric breakdown voltage failure portion 23 because of anodic oxidation, and the passivation layer 50 is formed on the surface of the silicon substrate 1. The magnitude of the high pulse voltage may be controlled so that the passivation layers 10 are not formed on the parts of the surface of the capacitor upper electrode 24 which are insulated by the capacitor dielectric film 21 and opposed to the capacitor lower electrode 19, with the capacitor dielectric film 21 therebetween. The capacitor upper electrode 24 in the regions on which the passivation layers 10 are not formed is chemically etched by the chemical etchant 7 in parallel with the voltage application. Thus, as illustrated in FIG. 24, the polysilicon film of the capacitor upper electrode 24 remains only on the defect 22 and dielectric breakdown voltage failure portion 23.

Each amount of the passivation layers 10 to be formed is greater than each amount of the passivation layers 10 to be removed by chemical etching when the high pulse voltage is applied, and the former is less than the latter when the low pulse voltage is applied. The passivation layers 10 repeatedly grow and shrink, prevented from reaching an excessive amount. Further, adjustment of the pulse width duty cycle provides balanced growth and shrinkage of the passivation layers 10 in order to control the size of the passivation layers 10. For a balanced condition, the pulse width duty cycle is preferably not more than 50% as in the second preferred embodiment and the second example.

With the DC voltage applied to the silicon substrate 1 as in the third example, the passivation layers 10 might grow excessively, resulting in the disadvantages of FIGS. 5 and 6 during evaluation. The fourth example, however, provides a suitable amount of the passivation layers 10 formed on the individual defect 22 and dielectric breakdown voltage failure portion 23. The method of the fourth example appropriately evaluates the size and the position of the defect 22 and dielectric breakdown voltage failure portion 23 in the same manner as the second preferred embodiment.

The pulse voltage is used for anodic oxidation in the fourth example to control the amount of the passivation layers 10 formed on the defect 22 and dielectric breakdown voltage failure portion 23. Therefore, the method of the fourth example is effective when the defect 22 and dielectric breakdown voltage failure portion 23 are large in size or positioned adjacent to each other.

In the fourth example, similar to the third example, the process for forming the passivation layers 10 and the etching of the polysilicon film in the regions on which the passivation layers 10 are not formed by alkali may be performed simultaneously, achieving simple and quick evaluation. The value of the pulse voltage applied to the silicon substrate 1 may be greater than the value which permits the passivation layers 10 to be formed only on the polysilicon film in the regions overlying the defect 22 and dielectric breakdown voltage failure portion 23 in the capacitor dielectric film 21, thereby enabling to form the passivation film 10 on the polysilicon film in a wide area on the capacitor dielectric film 21 having the defect 22 and dielectric breakdown voltage failure portion 23. Thus, the parts of the polysilicon film which overlies the defect 22 and dielectric breakdown voltage failure portion 23 are not chemically etched but remain unremoved. This allows the evaluation of the presence or absence and position of the defect 22 and dielectric breakdown voltage failure portion 23.

While the invention has been described in detail, the foregoing description is in all aspects illustrative and not restrictive. It is understood that numerous other modifications and variations can be devised without departing from the scope of the invention.

We claim:

1. A method of evaluating a semiconductor device, comprising the steps of:
   (a) immersing in a solution containing a hydroxyl group a semiconductor device including a first semiconductor layer, an insulating film formed on said first semiconductor layer, and a second semiconductor layer formed on said insulating film; and
   (b) applying voltage to said solution, with said first semiconductor layer serving as an anode.

2. The method of claim 1, wherein said solution is selected from the group consisting of KOH, NaOH, LiOH, CsOH, $NH_4OH$, ethylenediamine pyrocatechol, hydrazine, and choline.

3. The method of claim 1, wherein the value of said voltage is varied.

4. The method of claim 1, wherein said semiconductor device is an EEPROM comprising a semiconductor substrate, a gate oxide film, and a floating gate electrode corresponding respectively to said first semiconductor layer, said insulating film, and said second semiconductor layer.

5. The method of claim 3, wherein said semiconductor device is an EEPROM comprising a semiconductor substrate, a gate oxide film, and a floating gate electrode corresponding respectively to said first semiconductor layer, said insulating film, and said second semiconductor layer.

6. The method of claim 1, wherein said semiconductor device is a DRAM comprising a capacitor lower electrode, a capacitor insulating film, and a capacitor upper electrode corresponding respectively to said first semiconductor layer, said insulating film, and said second semiconductor layer.

7. The method of claim 3, wherein said semiconductor device is a DRAM comprising a capacitor lower electrode, a capacitor insulating film, and a capacitor upper electrode corresponding respectively to said first semiconductor layer, said insulating film, and said second semiconductor layer.

8. The method of claim 3, wherein said value of said voltage is periodically varied.

9. The method of claim 3, wherein said value of said voltage includes a first voltage value and a second voltage value lower than said first voltage value, said first and second voltage values being alternated repeatedly.

10. The method of claim 8, wherein said value of said voltage includes a first voltage value and a second voltage value lower than said first voltage value, said first and second voltage values being alternated repeatedly.

11. The method of claim 1, wherein said solution is a 5N KOH solution at a temperature of 60° C., and said first voltage value is several to tens of volts.

12. The method of claim 9, wherein said solution is a 5N KOH solution at a temperature of 60° C., and said first voltage value is several to tens of volts.

13. The method of claim 10, wherein said solution is a 5N KOH solution at a temperature of 60° C., and said first voltage value is several to tens of volts.

14. The method of claim 9, wherein a pulse width duty cycle of said voltage is not more than 50%.

15. The method of claim 10, wherein a pulse width duty cycle of said voltage is not more than 50%.

* * * * *